US010006949B2

(12) United States Patent
Toender et al.

(10) Patent No.: US 10,006,949 B2
(45) Date of Patent: Jun. 26, 2018

(54) METHOD AND APPARATUS FOR A PARALLEL FREQUENCY-MASK TRIGGER

(75) Inventors: Nico Toender, Haar (DE); Markus Reiband, Zorneding (DE); Bernhard Nitsch, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1058 days.

(21) Appl. No.: 14/237,558

(22) PCT Filed: Aug. 3, 2012

(86) PCT No.: PCT/EP2012/065223
§ 371 (c)(1),
(2), (4) Date: Oct. 7, 2014

(87) PCT Pub. No.: WO2013/020905
PCT Pub. Date: Feb. 14, 2013

(65) Prior Publication Data
US 2015/0088447 A1    Mar. 26, 2015

(30) Foreign Application Priority Data
Aug. 10, 2011   (DE) .................. 10 2011 080 730

(51) Int. Cl.
*G01R 23/18*     (2006.01)
*G01R 13/02*     (2006.01)

(52) U.S. Cl.
CPC ........... *G01R 23/18* (2013.01); *G01R 13/029* (2013.01); *G01R 13/0254* (2013.01)

(58) Field of Classification Search
CPC .. G01R 13/0254; G01R 23/18; G01R 13/029; G01R 23/16
See application file for complete search history.

(56) References Cited

U.S. PATENT DOCUMENTS 7,225,093 B1 *  5/2007  Corredoura ........ G01R 13/0254
                                                  324/76.11
2006/0025947 A1  2/2006  Earls
(Continued)

FOREIGN PATENT DOCUMENTS

DE   102009013617 A1   8/2010
EP       2219039 A2    8/2010
EP       2264892 A2   12/2010

OTHER PUBLICATIONS

Machine-generated translation of DE102009013617, published on Aug. 2010.*
(Continued)

*Primary Examiner* — Huan Tran
(74) *Attorney, Agent, or Firm* — Potomac Technology Law, LLC

(57) ABSTRACT

The frequency-mask trigger unit comprises n trigger machines, where n≥2, in order to evaluate a total of n signal paths. In this context, the n trigger machines are connected to an evaluation unit. For this purpose, at least one trigger range is transferred to the n trigger machines. Moreover, a plurality of result vectors of a signal under analysis transformed into the frequency domain are transferred via the n signal paths to the n trigger machines. Finally, each of the n trigger machines checks whether at least one of the plurality of result vectors of the signal under analysis transformed into the frequency domain infringes the at least one trigger range.

18 Claims, 6 Drawing Sheets

(56) References Cited

U.S. PATENT DOCUMENTS

2007/0118317 A1    5/2007    Corredoura
2007/0222430 A1    9/2007    Sullivan et al.
2011/0137594 A1    6/2011    Sullivan et al.

OTHER PUBLICATIONS

Verret et al. "Custom FPGA-Based Tests with COTS Hardware and Graphical Programming", 2010 IEEE AUTOTESTCON, 8-1-4244-7961-0/10/$26.00 © 2010 IEEE.*
"International Preliminary Report on Patentability", PCT/EP2012/065223, dated Feb. 20, 2014.
"Fundamentals of Real-Time Spectrum Analysis", 37W-17249-4, Tektronix, 2009, Aug. 2009.
"Understanding FFT Overlap Processing Fundamentals", 37W-18839-1, Tektronix, 2009, Aug. 2009.
Hill, Thomas, "Real-Time Spectrum Analysis Reveals Time Domain Characteristics of Frequency Domain Signals", 978-1-4244-2300-2, IEEE, 2008, 2008.
Verret, Ryan et al., "Custom FPGA-Based Tests with COTS Hardware and Graphical Programming", 978-1-4244-7961-0, IEEE, 2010, 2010.

* cited by examiner

METHOD AND APPARATUS FOR A PARALLEL FREQUENCY-MASK TRIGGER

CROSS-REFERENCE TO RELATED APPLICATION(S)

The present application is a national phase application of PCT application No. PCT/EP2012/065223, filed Aug. 3, 2012, and claims priority to German Patent Application No. DE 102011080730.6, filed Aug. 10, 2011, the entire contents of which are incorporated herein by reference.

FIELD

The invention relates to a frequency-mask trigger unit and a method for operating the frequency-mask trigger unit, such as can be used, for example, in a spectrum analyzer.

BACKGROUND

One means of analyzing signals is, for example, to observe the spectrum. The measuring devices used for this purpose must, on the one hand, provide the widest possible bandwidth so that signal components with different frequencies can be registered securely and, on the other hand, the signal component registered must be compared continuously with a threshold value, so that a trigger pulse can be output whenever the threshold value set is either overshot or undershot. For example, with EMC measurements (electromagnetic compatibility), it is desirable to register even very short interferers. To achieve this goal, the signal is sampled with the fastest possible sampling rate. The sampled and digitized signal must then be further processed with an extremely fast computer in order to extract the required information.

A frequency-mask trigger unit which allows a triggering with signals under analysis which are transformed into the frequency domain is known from EP 2 219 039 A2, whereas the amplitude of these signals can fluctuate strongly. The disadvantage with EP 2 219 039 A2 is that short interferers within the signal under analysis can only be detected with difficulty using the frequency-mask trigger unit presented.

What is needed, therefore, is a frequency-mask trigger approach that provides a solution for detecting short interference pulses occurring in the time domain as securely as possible.

SUMMARY

Embodiments of the present invention advantageously address the foregoing requirements and needs, as well as others, by providing a method and apparatus for a frequency mask trigger that is capable of detecting short interference pulses occurring in the time domain in a secure manner.

According to an example embodiment of the present invention, a method for operating a frequency-mask trigger unit, whereas the frequency-mask trigger unit comprises n trigger machines, where n≥2, for the evaluation of a total of n signal paths, whereas the n trigger machines are connected to an evaluation unit, provides several method steps. In a first method step, at least one trigger range is transferred to the n trigger machines. In a further method step, a plurality of result vectors of a signal under analysis transformed into the frequency domain is transferred via the n signal paths to the n trigger machines. In a next method step, a check is carried out to determine whether at least one of the plurality of result vectors of the signal under analysis transformed into the frequency domain infringes the at least one trigger range. This is performed by each of the n trigger machines.

In the case of such methods according to example embodiments of the present invention for operating the frequency-mask trigger unit, it is advantageous that the frequency-mask trigger unit comprises n trigger machines, where n≥2, because, as a result, a plurality of result vectors of a signal under analysis transformed into the frequency domain can be compared in parallel with a threshold value, that is, by comparison with at least one trigger range. This means that a relatively large datastream which is subdivided between a plurality of result vectors can be checked by trigger machines arranged in parallel against a threshold value, so that the signal under analysis can be recorded with a fast sampling rate, so that infrequent interferers, including those present in the time domain only for a very short time, can be detected securely.

In the case of a frequency-mask trigger unit according to example embodiments of the present invention, the unit comprises n trigger machines, where n≥2, for the evaluation of a total of n signal paths. In this context, the n trigger machines are connected to an evaluation unit. The n trigger machines load at least one trigger range from at least one storage unit connected to the frequency-mask trigger unit. Furthermore, a plurality of result vectors of a signal under analysis transformed into the frequency domain is transferred to the n trigger machines via the n signal paths. Each of the n trigger machines checks whether at least one of the plurality of result vectors of the signal under analysis transformed into the frequency domain infringes the at least one trigger range.

In the case of such frequency-mask trigger units according to example embodiments of the present invention, it is advantageous that a datastream transformed into the frequency domain is compared by at least two trigger machines in parallel with at least one loaded trigger range. Accordingly, the signal under analysis can be sampled with a sampling rate which is significantly faster than the system-clock pulse with which each of the n trigger machines is operated.

Furthermore, it is advantageous with methods according to example embodiments of the present invention for operating a frequency-mask trigger unit if the trigger status of the respective n trigger machines is transferred to the evaluation unit as soon as the respective trigger machine has compared the respective result vector with the at least one trigger range. This allows all of the trigger statuses of the n trigger machines to be evaluated centrally by the evaluation unit, and the evaluation unit represents a kind of central memory for the frequency-mask trigger unit.

Furthermore, an advantage is achieved with methods according to example embodiments of the present invention for operating the frequency mask trigger unit, if the result vectors on the n signal paths are delayed by at least one system-clock pulse relative to one another, so that they do not arrive at the n trigger machines in a synchronous manner. This means that within one system-clock pulse, two trigger machines do not communicate their trigger status simultaneously to the evaluation unit. Accordingly, the evaluation unit can be structured in a particularly simple manner, because it must evaluate the trigger status of a maximum of only one of the n trigger machines within one system-clock pulse.

Moreover, an advantage is achieved with methods according to example embodiments of the present invention for operating the frequency-mask trigger unit if the respective result vectors which infringe the at least one trigger range are stored by the evaluation unit in at least one storage unit, or if a timestamp is generated for all result vectors, and all result vectors provided with a timestamp are stored in the at least one storage unit in order to store the timestamp of the result vector which infringes the at least one trigger range additionally. This allows the measurement to be continued and the corresponding result vectors which have infringed the at least one trigger range to be observed at a later time. This once again reduces the downtime of a measuring device in which the method according to example embodiments of the invention for operating the frequency-mask trigger unit is implemented because the measuring process itself is not interrupted.

Furthermore, an advantage is achieved with frequency-mask trigger units according to example embodiments of the present invention, if a plurality of result vectors of different signals under analysis transformed into the frequency domain is transferred via the n signal paths to the n trigger machines. This means that different signals, which can be supplied to the underlying measuring device, for example, via different input ports, can be analyzed with the frequency-mask trigger unit according to example embodiments of the invention.

An advantage is also achieved with frequency-mask trigger units according to example embodiments of the present invention if the n trigger machines are arranged parallel to one another in order to evaluate the total of n signal paths in parallel and/or if the plurality of result vectors provide a time reference relative to one another and/or if each of the n trigger machines processes precisely one result vector at the same time and/or if each signal path connects an output of n transformation units, which calculate a fast Fourier transform, via a filter unit and/or a delay unit to the input of one of the n trigger machines and/or if the number of vector elements in each result vector corresponds to the length of the Fourier transform in the n transformation units and/or if each trigger machine transfers its trigger status to the evaluation unit as soon as the respective trigger machine has compared the last vector element in the respective result vector with the at least one trigger range and/or if the at least one trigger range is entered with the entry unit and displayed in the spectrum as a mask which describes an area, or as a line, and if the at least one trigger range is infringed whenever a vector element of at least one result vector is disposed in the area defined by the mask, or overshoots or undershoots the line.

It is advantageous if, within frequency-mask trigger units according to example embodiments of the present invention, each signal path connects an output of one of n transformation units which calculate a fast Fourier transform via a filter unit and/or a delay unit to the input of one of the n trigger machines, because, as a result, the signal under analysis can be sampled with a very fast sampling rate, in order still to be transformed into the frequency domain in a short time.

Furthermore, it is advantageous if each trigger machine, according to example embodiments of the present invention, only transfers its trigger status to the evaluation unit as soon as the respective trigger machines has compared the last vector element in the respective result vector with the at least one trigger range, because this ensures that the correspondingly modified trigger status of the respective trigger machine is still transferred to the evaluation unit, even if the last vector element infringes the at least one trigger range. Moreover, it is advantageous, if the at least one trigger range can be entered or plotted in the spectrum as a mask which defines an area or as a line, because this can be displayed in a visually clear manner.

BRIEF DESCRIPTION OF THE DRAWINGS

Various exemplary embodiments of the invention are described by way of example below with reference to the drawings. Identical subject matters provide the same reference numbers. In detail, the corresponding figures of the drawings show.

DETAILED DESCRIPTION

Figure 1:
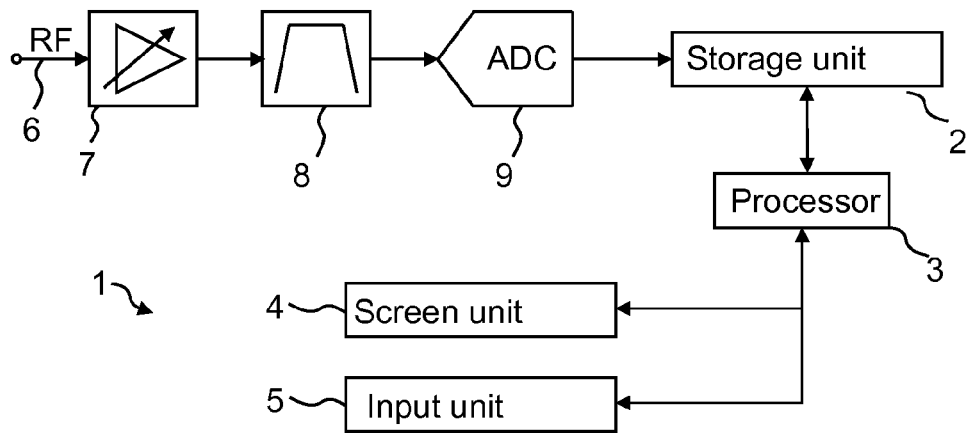
FIG. 1 a block-circuit diagram, which illustrates a measuring device, which contains the frequency-mask trigger unit according to example embodiments of the invention.

FIG. 1 shows a block-circuit diagram which illustrates the structure of a measuring device 1, for example, a real-time spectrum analyzer, which contains the frequency-mask trigger unit 50 according to example embodiments of the invention. In this context, the measuring device 1 for calculating a spectrum of a signal 6 under analysis comprises at least one central data-processing unit 3. The at least one central data-processing unit 3 may comprise, for example, one or more processors and/or field programmable gate arrays (FPGAs) and/or digital signal processors (DSPs) and/or application specific integrated circuits (ASICs). At least one storage unit 2, a screen unit 4 and an input unit 5 are connected to the at least one central data-processing unit 3.

The at least one storage unit 2 can be, for example, a random access memory, which is embodied within the measuring device 1 and provides a very fast data rate. Special flash memories can also be used. As will be explained in greater detail below, the spectrum of the signal 6 under analysis is determined in the central data-processing unit 3 and compared within the frequency-mask trigger unit 50 with at least one adjustable trigger range.

A high-frequency signal 6 under analysis is amplified in its amplitude by an amplifier 7. Following this, the amplified high-frequency communications signal 6 is filtered through a bandpass 8, before it is digitized by an analog-digital converter 9. The digitized high-frequency signal is then stored in the storage unit 2. For example, the storage unit 2 is structured as a fast ring memory. If the signal 6 under analysis is a signal 6 which is broadcast, for example, from a base station, an attenuation element or a coupler, at the output of which a signal with substantially smaller amplitude is present, is used instead of an amplifier 7.

Figure 2:
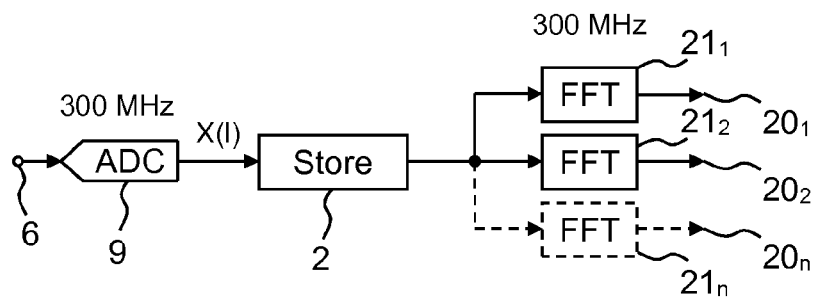
FIG. 2 a block-circuit diagram, which illustrates how n parallel signal paths are generated from a serial datastream by means of n parallel transformation units according to example embodiments of the invention.

FIG. 2 shows a block-circuit diagram, which illustrates how several result vectors $22_1$, $22_2$ to $22_n$ which are output on n parallel signal paths $20_1$, $20_2$ to $20_n$ are generated from a serial datastream by means of n parallel transformation units $21_1$, $21_2$ to $21_n$ according to example embodiments of the invention. The analog-digital converter 9, which digitizes the signal 6 under analysis with a sampling rate of 300 MHz and stores it in the at least one storage unit 2 is shown. In the exemplary embodiment from FIG. 2, the transformation units $21_1$, $21_2$ to $21_n$ are connected to the at least one storage unit 2. The system-clock pulse with which the transformation units $21_1$, $21_2$ to $21_n$ are operated, corresponds in the exemplary embodiment from FIG. 2 to the sampling rate of the analog-digital converter 9 and is therefore, for example, 300 MHz. Accordingly, each of the n transformation units $21_1$, $21_2$ to $21_n$ is capable of calculating the spectrum of the signal 6 under analysis in step, that is, in real-time. The Fast Fourier Transform (FFT) length L, which the transformation units $21_1$, $21_2$ to $21_n$ use, is identical for all of these transformation units $21_1$, $21_2$ to $21_n$. For example, in order to realize an increased overlap, the individual transformation units $21_1$, $21_2$ to $21_n$ do not use the same sampling values for calculating the Fourier transform but begin with an offset. At the start of the individual transformation units $21_1$, $21_2$ to $21_n$, a result vector $22_1$, $22_2$, $22_3$, $22_4$ is present in each case which comprises precisely as many vector elements as the length L of the, preferably fast, Fourier transform.

It is evident that the signal 6 under analysis is transformed into the frequency domain by means of the n transformation units $21_1$, $21_2$ to $21_n$ arranged in parallel. As a result of the overlapping, an interferer which occurs within the edge region in one of the spectrum calculated by a transformation unit $21_1$, $21_2$ to $21_n$ is less strongly attenuated and can still be securely identified, so that it is possible to speak of a gap-free observation, that is, a real-time observation. At the output of the n transformation units $21_1$, $21_2$ to $21_n$, the result vectors $22_1$, $22_2$, $22_3$, $22_4$ are output on the n parallel signal paths $20_1$, $20_2$ to $20_n$.

Figure 3:
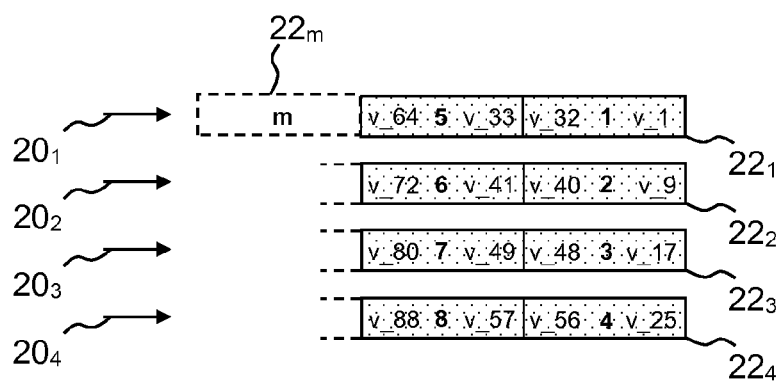
FIG. 3 a block-circuit diagram, which illustrates how the result vectors are structured in parallel signal paths according to example embodiments of the invention.

FIG. 3 shows a block-circuit diagram, which illustrates how the result vectors $22_1$, $22_2$, $22_3$, $22_4$ are structured in the parallel signal paths $20_1$, $20_2$, $20_3$, $20_4$ according to example embodiments of the invention. It is evident that, in the exemplary embodiment, eight result vectors are present, which are transmitted on four signal paths $20_1$, $20_2$, $20_3$, $20_4$.

The fast Fourier transform, as can be calculated, for example, in the computer units $21_1$, $21_2$ to $21_n$ in FIG. 2, provides a length of 32. This means that each result vector $22_1$, $22_2$, $22_3$, $22_4$ from FIG. 2 also comprises 32 vector elements. FIG. 3 shows the sampled values from which the frequency bins disposed in result vector $22_1$, $22_2$, $22_3$ and $22_4$ are composed within each result vector $22_1$, $22_2$, $22_3$ and $22_4$. In the result vector $22_1$, the 32 frequency bins, which are stored in the 32 vector elements, are composed of the sampled values 1 to 32, which are transformed into the frequency domain. The 32 frequency bins of the second result vector $22_2$ are composed of a Fourier transform of the sampled values 9 to 40. In the exemplary embodiment from FIG. 3, this composition is presented for all eight result vectors $22_1$, $22_2$, $22_3$, $22_4$, whereas the corresponding reference numbers are entered in the figures of the drawings only for four result vectors $22_1$, $22_2$, $22_3$, $22_4$. In total, m result vectors $22_1$, $22_2$ to $22_m$ are transmitted on n signal paths $20_1$, $20_2$ to $20_n$, whereas m≥n. In this context, a total of n result vectors $22_1$, $22_2$ to $22_n$ are transmitted in parallel on the n signal paths $20_1$, $20_2$ to $20_n$.

As will be explained in greater detail below, the frequency-mask trigger unit 50 according to example embodiments of the invention checks whether at least one of the plurality of result vectors $22_1$, $22_2$ to $22_m$ of the signal 6 under analysis transformed into the frequency domain infringes the at least one trigger range.

Figure 4:
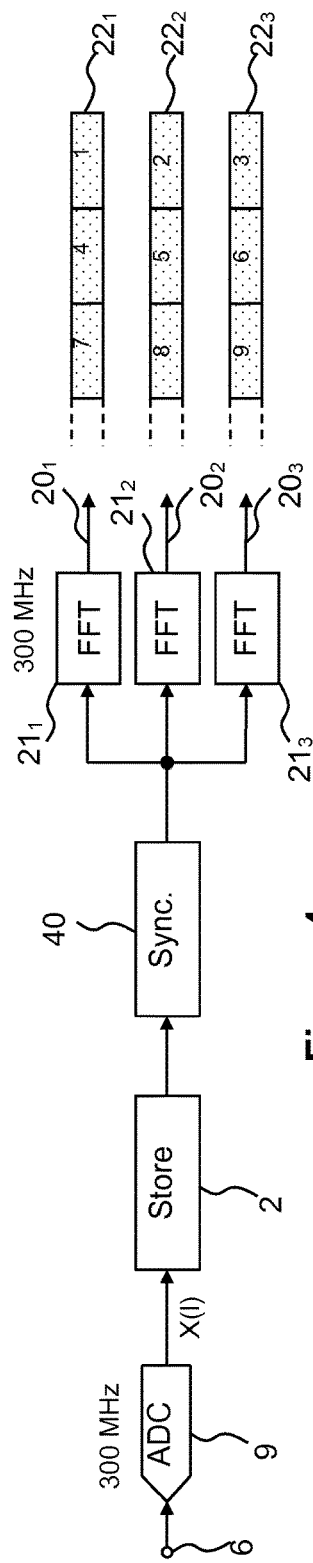
FIG. 4 a block-circuit diagram, which illustrates how mutually parallel and synchronized result vectors are generated from a serial datastream by means of parallel transformation unit and a synchronization unit according to example embodiments of the invention.

FIG. 4 shows a block-circuit diagram, which illustrates how mutually parallel and synchronized result vectors $22_1$, $22_2$, $22_3$ are generated from a serial datastream by means of parallel transformation units $21_1$, $21_2$, $21_3$ and a synchronization unit 40 according to example embodiments of the invention. In the exemplary embodiment from FIG. 4, a total of nine result vectors are shown, whereas only three result vectors $22_1$, $22_2$, $22_3$ are provided with reference numbers.

An analog-digital converter 9 digitizes the signal 6 under analysis with a sampling rate of, for example, 300 MHz and stores the digitized signal 6 under analysis in the at least one storage unit 2. The at least one storage unit 2 is further connected to a synchronization unit 40. The synchronization unit 40 is once again connected to the individual parallel transformation units $21_1$, $21_2$, $21_3$. As a result of the synchronization, the identical vector elements of the different result vectors $22_1$, $22_2$, $22_3$ are disposed at the output of the different parallel transformation units $21_1$, $21_2$ and $21_3$ with the same vector index with pulse synchronized relative to one another. Simplifications in filtering (resampling), for example, are achieved as a result of the synchronization, because the same filter coefficient can be used on all result vectors $22_1$, $22_2$, $22_3$, and different filter coefficients need not be loaded within one system-clock pulse for the individual result vectors $22_1$, $22_2$, $22_3$. Moreover, a decimation of the individual result vectors $22_1$, $22_2$, $22_3$ to form a single result vector $22_1$, $22_2$, $22_3$ is very readily realized, because no further intermediate buffering is necessary, in order to wait until the same vector element is present in all result vectors $22_1$, $22_2$, $22_3$.

Figure 5:
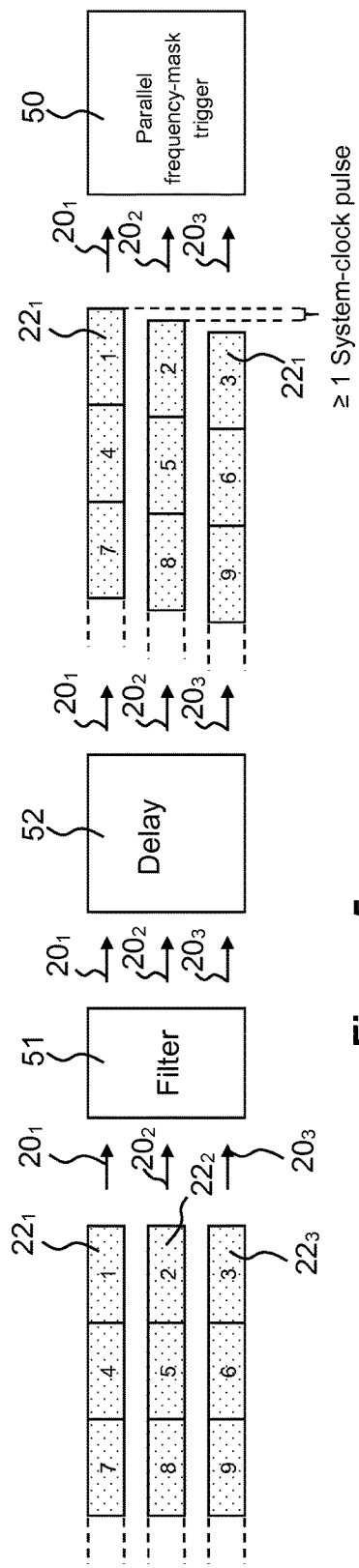
FIG. 5 a block-circuit diagram, which illustrates how the mutually parallel and synchronized result vectors are transferred, filtered and delayed, to the parallel frequency-mask trigger unit according to example embodiments of the invention.

FIG. 5 shows a block-circuit diagram, which illustrates how the mutually parallel and synchronized result vectors $22_1$, $22_2$, $22_3$ are transferred to the parallel frequency-mask trigger unit 50 according to example embodiments of the invention, filtered and delayed. In the exemplary embodiment from FIG. 5, the result vectors $22_1$, $22_2$, $22_3$ generated in FIG. 4 are supplied on the three signal paths $20_1$, $20_2$ and $20_3$ to a filter unit 51. On the basis of the fact that the result vectors $22_1$, $22_2$, $22_3$ in FIG. 4 have been synchronized by the synchronization unit 40, the respective vector elements are available in the result vectors $22_1$, $22_2$, $22_3$ at the same time within the filter unit 51. In the further course, the filter unit 51 can use the same filter coefficients on all result vectors $22_1$, $22_2$, $22_3$ and need not load different filter coefficients for the individual result vectors $22_1$, $22_2$, $22_3$ within one system-clock pulse and within these, for the individual vector elements.

Following this, the filtered result vectors $22_1$, $22_2$, $22_3$ at the output of the filter unit 51 are supplied via the signal paths $20_1$, $20_2$, $20_3$ to the input of a delay unit 52. At the output of the delay unit 52, the filtered result vectors $22_1$, $22_2$, $22_3$ are present with a delay relative to one another. It is evident that the individual result vectors $22_1$, $22_2$, $22_3$, which are transmitted on the different signal paths $20_1$, $20_2$, $20_3$ provide a time offset relative to one another.

In the exemplary embodiment from FIG. 5, the result vector $22_2$ is delayed relative to the result vector $22_1$ by at least one system-clock pulse. The same also applies for the result vector $22_3$, which is delayed by comparison with the result vector $22_2$ and therefore also relative to the result vector $22_1$ by at least one system-clock pulse. By contrast, the result vectors which follow one another within a signal path $20_1$ or $20_2$ or $20_3$ are not additionally delayed. The output of the delay unit 52 is connected to the frequency-mask trigger unit 50 according to example embodiments of the invention. The delayed result vectors $22_1$, $22_2$, $22_3$ are transmitted on the signal paths $20_1$, $20_2$, $20_3$ to the frequency-mask trigger unit 50.

Figure 6A:
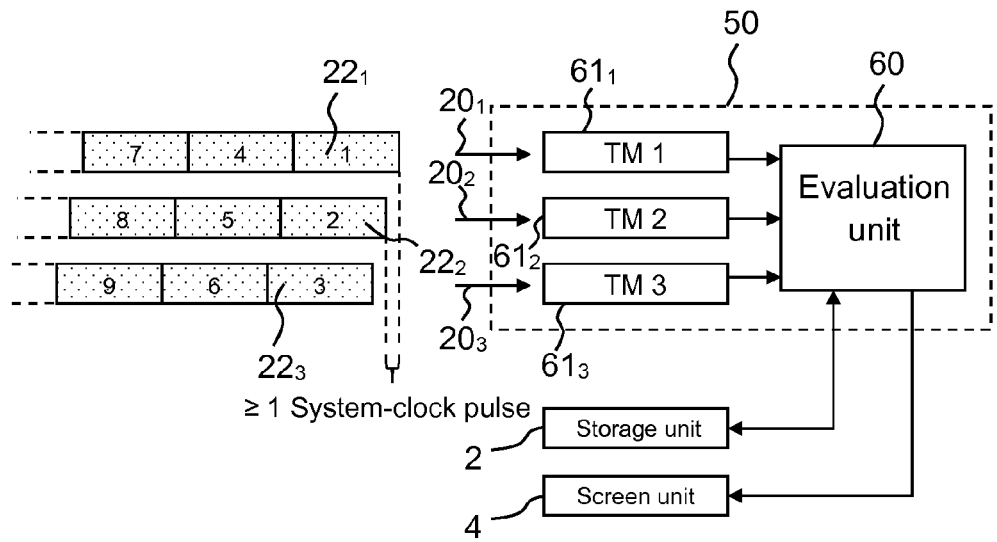
FIG. 6A a block-circuit diagram, which further illustrates the structure of the frequency-mask trigger unit for three signal paths according to example embodiments of the invention.

FIG. 6A shows a block-circuit diagram, which further illustrates the structure of the frequency-mask trigger unit 50 according to example embodiments of the invention for three signal paths $20_1$, $20_2$, $20_3$. The result vectors $22_1$, $22_2$, $22_3$ transmitted on the individual signal paths $20_1$, $20_2$, $20_3$, which are delayed relative to one another by at least one system-clock pulse, are evident. The frequency-mask trigger unit 50 provides n trigger machines $61_1$, $61_2$, $61_3$, whereas n is at least 2, in order to evaluate a total of n signal paths $20_1$, $20_2$, $20_3$. In the exemplary embodiment from FIG. 6A, the value 3 is provided for n, so that there are a total of three trigger machines $61_1$, $61_2$, $61_3$, of which the input is also connected to the three signal paths $20_1$, $20_2$, $20_3$.

At least one trigger range is supplied to the three trigger machines $61_1$, $61_2$, $61_3$. This at least one trigger range can be entered by a user with the entry unit 5. However, this one trigger range can also be loaded by the trigger machines $61_1$, $61_2$, $61_3$ from the at least one storage unit 2. Within the at least one storage unit 2, different trigger ranges can be stored. Dependent upon the type of signal 6 under analysis, the trigger machines $61_1$, $61_2$, $61_3$ load the corresponding trigger range from the at least one storage unit 2. If the signal 6 under analysis is, for example, a Global System for Mobile Communications (GSM) signal, the trigger machines $61_1$, $61_2$, $61_3$ naturally only load from the at least one storage unit 2 a trigger range which covers the frequency range in which GSM networks are normally operated.

Such a trigger range can be, for example, a mask, which is defined in the spectrum and can be described in frequency and amplitude by an area. It is also possible for the at least one trigger range to be only a line which is drawn over a given frequency range with a given amplitude. Altogether, several trigger ranges can be plotted. In this context, the trigger ranges can also be displayed on the screen unit 4.

Furthermore, each of the trigger machines $61_1$, $61_2$, $61_3$ checks, for every vector element of every result vector $22_1$, $22_2$, $22_3$, whether the vector element infringes the trigger range or not. The vector elements are the sampled values of the digitized signal 6 under analysis transformed into the frequency domain. The vector elements are also the individual frequency bins which provide a given amplitude. A vector element infringes the trigger range, if the trigger machine $61_1$, $61_2$, $61_3$ determines that the vector element is disposed within a region defined by a mask, or overshoots or undershoots the line which is defined in frequency and amplitude and represents the trigger range. In this context, each trigger machine $61_1$, $61_2$, $61_3$ determines whether vector elements within the result vectors $22_1$, $22_2$, $22_3$ infringe the trigger range. Accordingly, it is also possible for each trigger machine $61_1$, $61_2$, $61_3$ to determine which vector element within the result vectors $22_1$, $22_2$, $22_3$ infringes the trigger range. As soon as each of the trigger machines $61_1$, $61_2$, $61_3$ has checked the last vector element of the result vector $22_1$, $22_2$, $22_3$ against the trigger range, the trigger status is transferred to the evaluation unit 60. If one of the L vector elements within a result vector $22_1$, $22_2$, $22_3$ infringes the at least one trigger range, the corresponding trigger machine $61_1$, $61_2$, $61_3$ outputs the message to the evaluation unit 60 that the trigger has been released. If none of the L vector elements of the result vectors $22_1$, $22_2$, $22_3$ infringes the at least one trigger range, the corresponding trigger machine $61_1$, $61_2$, $61_3$ either outputs no message to the evaluation unit 60, or the message that the trigger has not been released.

In view of the fact that the individual result vectors $22_1$, $22_2$, $22_3$ are delayed by at least one system-clock pulse by comparison with the vector elements $22_1$, $22_2$, $22_3$ which are disposed on other signal paths $20_1$, $20_2$, $20_3$, as described in FIG. 5, the trigger machines $61_1$, $61_2$, $61_3$ transmit the message to the evaluation unit 60 that the trigger has been released at different times. This is because of the fact that the trigger machines $61_1$, $61_2$, $61_3$ only generate the corresponding message and transmit it to the evaluation unit 60 after the evaluation of the last vector element of the corresponding result vector $22_1$, $22_2$, $22_3$. For this reason, the evaluation unit 60 must evaluate, as a maximum, the message from one trigger machine $61_1$, $61_2$, $61_3$ per system-clock pulse. This allows the evaluation unit 60 to be structured in a very simple manner. As soon as the evaluation unit 60 receives from one of the trigger machines $61_1$, $61_2$, $61_3$ the message that a trigger range has been infringed, the latter stores the relevant result vector $22_1$, $22_2$, $22_3$ in the at least one storage unit 2. Furthermore, it is possible for the relevant result vector $22_1$, $22_2$, $22_3$ to be decimated in such a manner that it corresponds to the resolution of the screen unit 4 and is preferably displayed on the screen unit 4 with the at least one trigger range. The analysis of the individual result vectors $22_1$, $22_2$, $22_3$ is not interrupted because of the fact that one of the trigger machines $61_1$, $61_2$, $61_3$ outputs to the evaluation unit 60 the message that a trigger range has been infringed, so that the digitized signal 6 under analysis can be analyzed continuously. This allows interferers occurring only very briefly and rarely within the time domain to be identified securely.

In view of the fact that all result vectors $22_1$, $22_2$, $22_3$ which infringe the at least one trigger range are stored in the at least one storage unit 2, these are still available for subsequent evaluation.

Figure 6B:
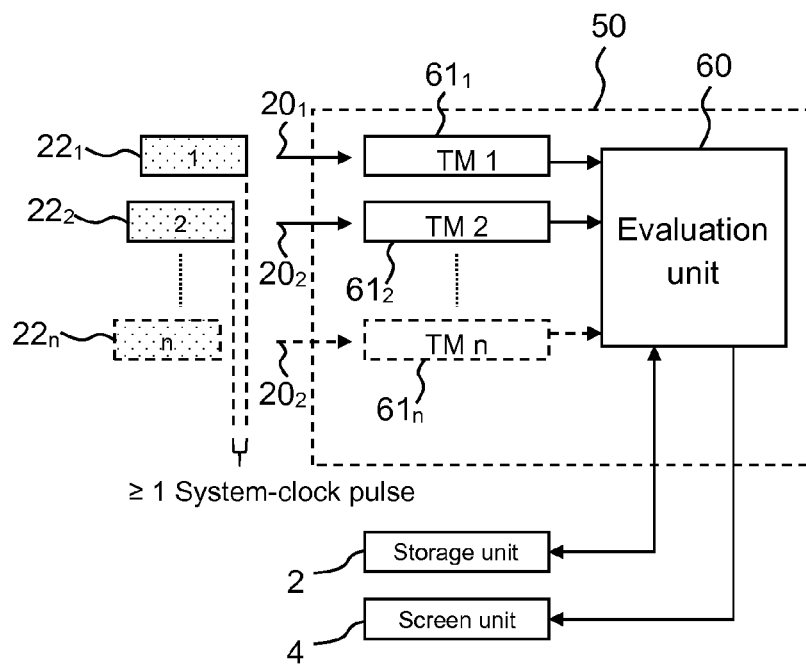
FIG. 6B a block-circuit diagram, which further illustrates the structure of the frequency-mask trigger unit for n signal paths according to example embodiments of the invention.

FIG. 6B shows a block-circuit diagram, which further illustrates the structure of the frequency-mask trigger unit 50 according to example embodiments of the invention for n signal paths $20_1$, $20_2$ to $20_n$. It is readily evident that the frequency-mask trigger unit 50 contains n trigger machines $61_1$, $61_2$ to $61_n$, to which n result vectors $22_1$, $22_2$ to $22_n$ are supplied on n signal paths $20_1$, $20_2$ to $20_n$ with a time delay in each case of at least one system-clock pulse, whereas n must have at least the value two. The n trigger machines $61_1$, $61_2$ to $61_n$ are once again connected to the evaluation unit $60$, which can, according to example embodiments of the invention, receive a maximum of one message from one of the n trigger machines $61_1$, $61_2$ to $61_n$ in each system-clock pulse. The evaluation unit $60$ stores that one of the n result vectors $22_1$, $22_2$ to $22_n$ which has infringed the trigger range in the at least one storage unit $2$. This storage can also be implemented directly from each of the n trigger machines $61_1$, $61_2$ to $61_n$. It is also possible for the evaluation unit $60$ or each of the n trigger machines $61_1$, $61_2$ to $61_n$ to store all result vectors $22_1$, $22_2$ to $22_n$ directly in the at least one storage unit $2$, whereas the evaluation unit $60$ also generates for each result vector $22_1$, $22_2$ to $22_n$ a timestamp, which indicates, for example, when the result vector $22_1$, $22_2$ to $22_n$ arrived in the frequency-mask trigger unit $50$ according to example embodiments of the invention and stores the latter together with the result vector $22_1$, $22_2$ to $22_n$. Furthermore, the timestamp from the result vector $22_1$, $22_2$ to $22_n$ which infringes the trigger range is stored separately by the evaluation unit $60$ in the at least one storage unit $2$.

Figure 7:
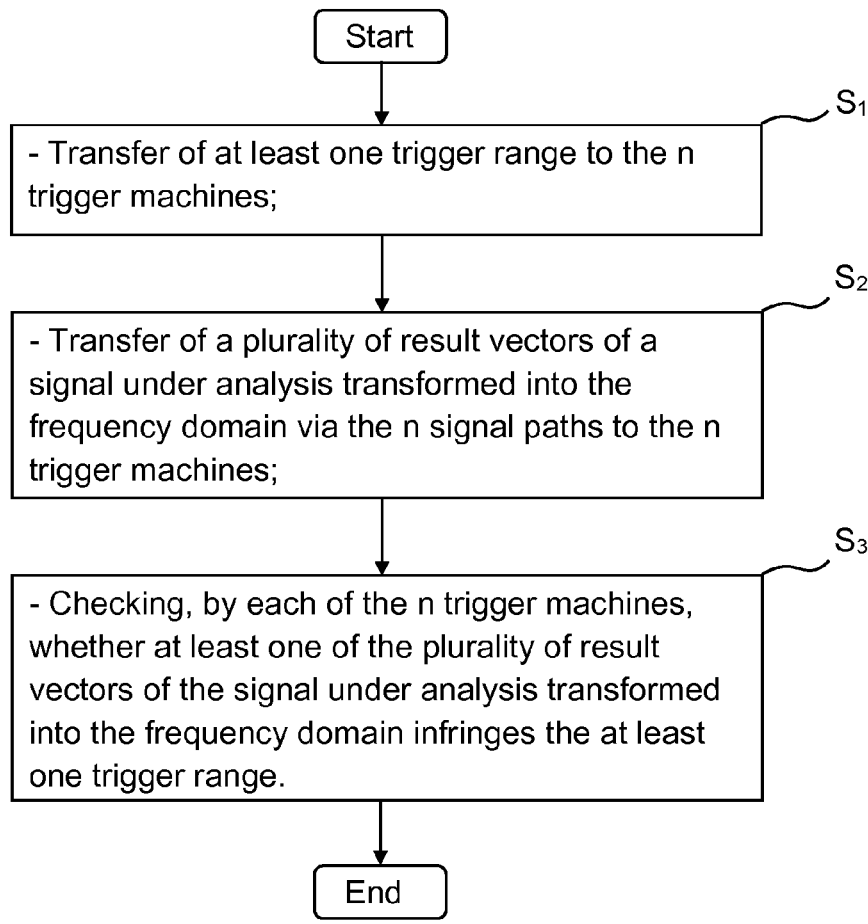
FIG. 7 a flow chart, which illustrates operation of a frequency-mask trigger unit according to example embodiments of the invention.

FIG. 7 shows a flow chart which illustrates a method for operating a frequency-mask trigger unit $50$ according to example embodiments of the invention. In a first method step $S_1$, at least one trigger range is transferred to the n trigger machines $61_1$, $61_2$ to $61_n$. This trigger range can be entered by a user via the entry unit $5$. However, the trigger range can also be loaded by the n trigger machines $61_1$, $61_2$ to $61_n$ from the at least one storage unit $2$. In this context, the trigger range can be a mask, which describes an area in the spectrum. The trigger range can also be a line, which is drawn in the spectrum in frequency and amplitude.

Following this, the method step $S_2$ is implemented. Within method step $S_2$, a plurality of result vectors $22_1$, $22_2$ to $22_n$ from a signal $6$ under analysis transformed into the frequency domain is transferred via n signal paths $20_1$, $20_2$ to $20_n$ to the n trigger machines $61_1$, $61_2$ to $61_n$.

Following this, method step $S_3$ is performed. Within method step $S_3$, a check is carried out to determine whether at least one of the plurality of result vectors $22_1$, $22_2$, $22_n$ to $22_m$ of the signal $6$ under analysis transformed into the frequency domain infringes the at least one trigger range. This is implemented by each of the n trigger machines $61_1$, $61_2$ to $61_n$.

Figure 8:
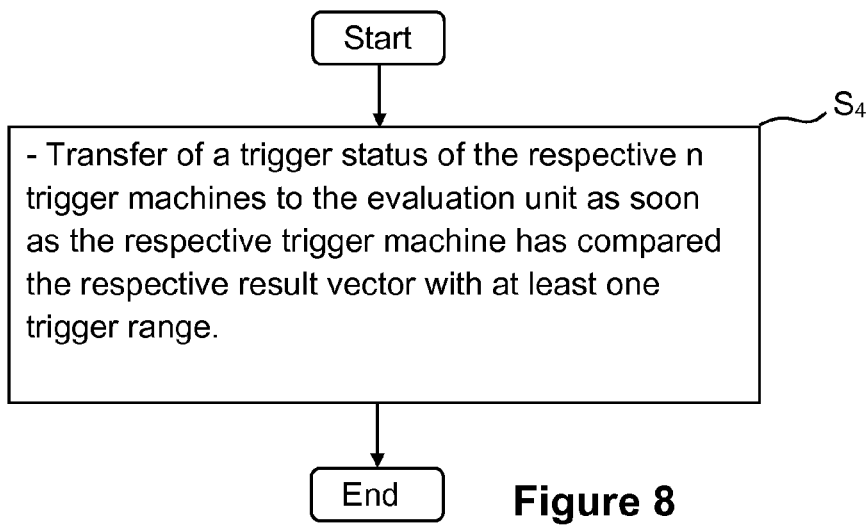
FIG. 8 a flow chart, which further illustrates how a trigger status of the respective n trigger machines is transferred within a frequency-mask trigger unit to the evaluation unit according to example embodiments of the invention.

FIG. 8 shows a flow chart which illustrates how a trigger status of the respective n trigger machines $61_1$, $61_2$ to $61_n$ is transferred within the frequency-mask trigger unit $50$ to the evaluation unit $60$ according to example embodiments of the invention. For this purpose, method step $S_4$ is provided, which can be implemented after method step $S_3$. Within method step $S_4$, a trigger status of each of the n trigger machines $61_1$, $61_2$ to $61_n$ is transferred to the evaluation unit $60$, as soon as the respective trigger machine $61_1$, $61_2$ to $61_n$ has compared the respective result vector $22_1$, $22_2$, $22_n$ to $22_m$ with the at least one trigger range. In this context, the trigger status describes the status of the n trigger machines $61_1$, $61_2$ to $61_n$ and indicates whether one of the n trigger machines $61_1$, $61_2$ to $61_n$ has been triggered. Accordingly, the trigger status is preferably transferred to the evaluation unit $60$, as soon as the last vector element within the each result vector $22_1$, $22_2$, $22_n$ to $22_m$ has been checked by the corresponding trigger machine $61_1$, $61_2$ to $61_n$ with regard to an infringement of the trigger range.

Figure 9:
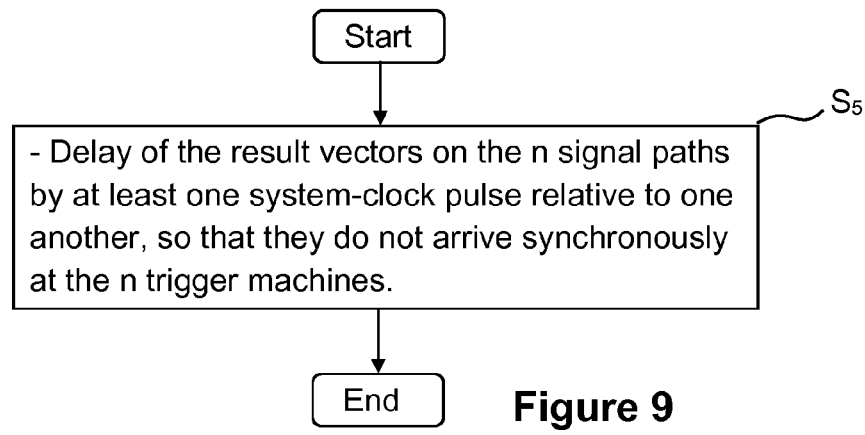
FIG. 9 a flow chart, which further illustrates how the result vectors are delayed relative to one another on the n parallel signal paths according to example embodiments of the invention.

FIG. 9 shows a flow chart which illustrates how the result vectors $22_1$, $22_2$, $22_n$ to $22_m$ are delayed relative to one another on the n parallel signal paths $20_1$, $20_2$ to $20_n$ according to example embodiments of the invention. For this purpose, method step $S_5$, which can be implemented after method step $S_1$, is carried out. Within method step $S_5$, the result vectors $22_1$, $22_2$, $22_n$ to $22_m$ are delayed on the n signal paths $20_1$, $20_2$ to $20_n$ by at least one system-clock pulse relative to one another, so that they do not arrive synchronously at the n trigger machines $61_1$, $61_2$ to $61_n$. Accordingly, all result vectors $22_1$, $22_2$, $22_n$ to $22_m$ on one signal path $20_1$, $20_2$ to $20_n$ are delayed by at least one system-clock pulse by comparison with the result vectors $22_1$, $22_2$, $22_n$ to $22_m$ on the other n–1 signal paths $20_1$, $20_2$ to $20_n$. This is achieved by a delay unit $52$, which is arranged upstream of the frequency-mask trigger unit $50$ according to example embodiments of the invention.

Figure 10:
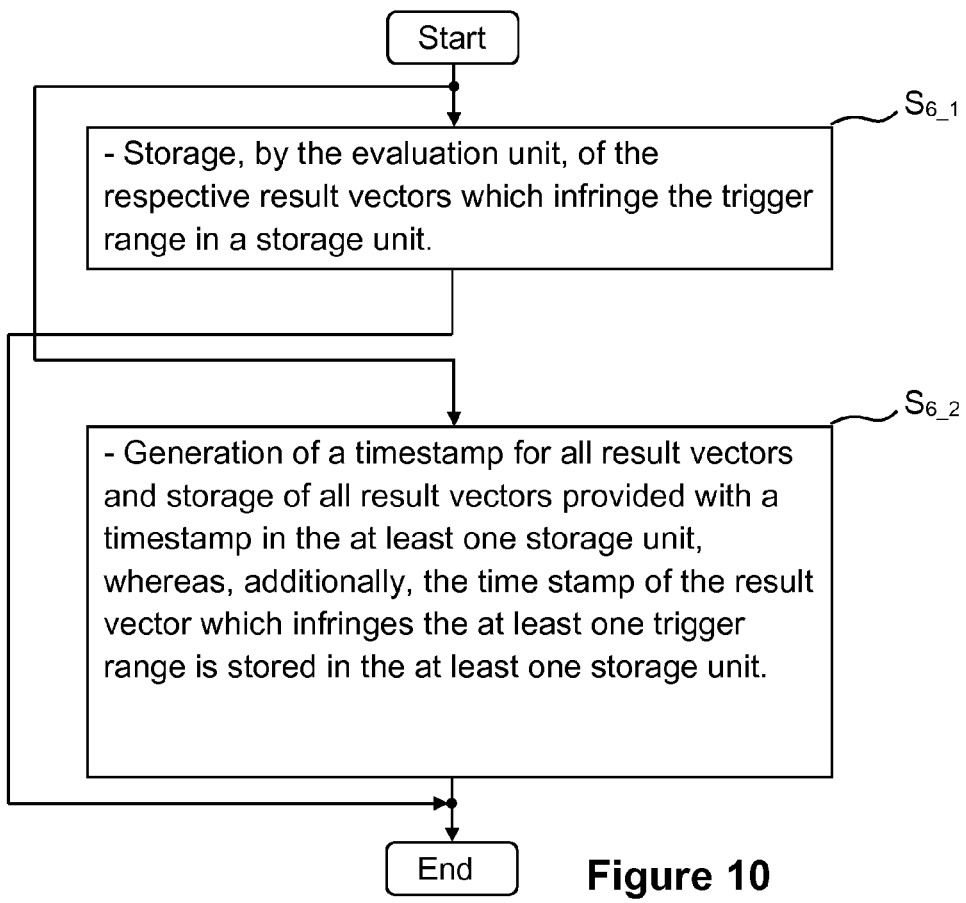
FIG. 10 a flow chart, which illustrates the result vectors that are stored in the at least one storage unit according to example embodiments of the invention.

FIG. 10 shows a flow chart which illustrates which of the result vectors $22_1$, $22_2$, $22_n$ to $22_m$ are stored in the at least one storage unit $2$ according to example embodiments of the invention. For this purpose, method step $S_{6\_1}$ or method step $S_{6\_2}$, which can be implemented after method step $S_4$, is performed. Within method step $S_{6\_1}$, the respective result vectors $22_1$, $22_2$, $22_n$ to $22_m$ which have infringed a trigger range are stored in the at least one storage unit $2$. This is implemented by the evaluation unit $60$. This allows the respective result vectors $22_1$, $22_2$, $22_n$ to $22_m$ to be evaluated in greater detail at a subsequent time, so that the measuring device, in which the frequency-mask trigger unit $60$ according to example embodiments of the invention is implemented, can continue with the analysis of the digitized signal $6$ under analysis without interruption.

Within method step $S_{6\_2}$, timestamps are generated by the evaluation unit $60$ for all result vectors $22_1$, $22_2$, $22_n$ to $22_m$. These timestamps indicate, for example, at which time the result vectors $22_1$, $22_2$, $22_n$ to $22_m$ have been supplied to the frequency-mask trigger unit $50$ according to example embodiments of the invention. Furthermore, all result vectors $22_1$, $22_2$, $22_n$ to $22_m$ are stored in the at least one storage unit $2$. Additionally, the timestamp of the result vector which has infringed the at least one trigger range is stored again in the at least one storage unit $2$ by the evaluation unit $60$. In a subsequent evaluation, all result vectors $22_1$, $22_2$, $22_n$ to $22_m$ of which the timestamp corresponds to the additionally stored timestamps can be loaded from the storage unit $2$. This means that, in the subsequent evaluation, result vectors $22_1$, $22_2$, $22_n$ to $22_m$ which are disposed directly before or after the result vector $22_1$, $22_2$, $22_n$ to $22_m$ which infringes the at least one trigger range can also be observed, whereas these result vectors $22_1$, $22_2$, $22_n$ to $22_m$ themselves have not infringed a trigger range. This would not be possible with the method step from $S_{6\_1}$, whereas the method step $S_{6\_2}$ requires more storage space in the at least one storage unit $2$.

Figure 11:
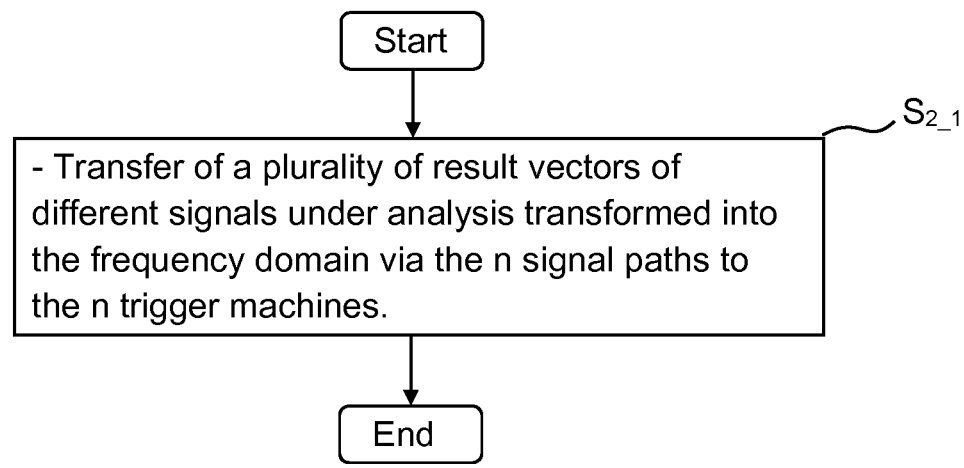
FIG. 11 a flow chart, which further illustrates how a plurality of result vectors, which originate from different signals under analysis, are transferred to the n trigger machines according to example embodiments of the invention.

FIG. 11 shows a flow chart which further illustrates how a plurality of result vectors $22_1$, $22_2$, $22_n$ to $22_m$ which originate from different signals under analysis, are transferred to the n trigger machines $61_1$, $61_2$ to $61_n$ according to example embodiments of the invention. For this purpose, the sub-method step $S_{2\_1}$ is implemented, which can be implemented within method step $S_2$. Within the sub-method step $S_{2\_1}$, a plurality of result vectors $22_1$, $22_2$, $22_n$ to $22_m$ of different signals under analysis transformed into the frequency domain are transferred via the n signal paths $20_1$, $20_2$ to $20_n$ to the n trigger machines $61_1$, $61_2$ to $61_n$. It is advantageous that different signals under analysis, which are supplied, for example, via a plurality of ports to the measuring device $1$, can be analyzed in this manner.

It is further advantageous that all trigger machines $61_1$, $61_2$ to $61_n$ are structured in an identical manner and determine all possible trigger statuses for every signal path $20_1$, $20_2$ to $20_n$ independently from one another.

One advantage with the delay of the n signal paths $20_1$, $20_2$ to $20_n$ is that, within one system-clock pulse, only one trigger status is transmitted to the evaluation unit 60. If there are n signal paths $20_1$, $20_2$ to $20_n$ and every trigger machine $61_1$, $61_2$ to $61_n$ can output k different trigger statuses, the evaluation unit 60 would have to be capable of processing n·k different messages per system-clock pulse from the n trigger machines $61_1$, $61_2$ to $61_n$. Here, it is very evident that the necessary computational cost within the evaluation unit 60 can be significantly reduced through the introduction of the delay unit 52 according to example embodiments of the invention, because the latter only needs to be able to process one trigger status per system-clock pulse.

The signal path $20_1$, $20_2$ to $20_n$ is a connection across which data can be transmitted. If the signal under analysis is sampled with a resolution of twelve bits, the signal path also comprises at least so many individual connections, in order to transmit the twelve bits, that is, the sampling value, within one system-clock pulse.

Within the scope of the invention, all of the features described and/or illustrated can be combined with one another as required. In particular, the dependent claims relating to the method can also be combined with the device claims relating to the frequency-mask trigger unit and vice versa.

The invention claimed is:

1. A method for operating a frequency-mask trigger unit, in order to evaluate a signal under analysis via a plurality of signal paths, wherein the signal under analysis has been converted into the frequency domain, the method comprising:
providing at least one trigger range to a plurality of trigger machines;
transmitting each of a plurality of result vectors of the signal under analysis via the plurality of signal paths to a respective one of the trigger machines, wherein each signal path connects an output of one of a plurality of transformation units to an input of a respective one of the trigger machines;
determining, by each of the transformation units, a Fast Fourier Transform (FFT) via a filter and a delay device;
identifying an interferer occurring within an edge region in a spectrum determined by each of the transformation units; and
determining, by each of the trigger machines, whether at least one of the plurality of result vectors infringes the at least one trigger range.

2. The method according to claim 1, further comprising:
providing a trigger status of each of the trigger machines to an evaluation unit once the respective trigger machine has determined whether the respective result vector infringes the at least one trigger range.

3. The method according to claim 1, further comprising:
delaying at least one of the result vectors by at least one system-clock pulse relative to the other result vectors, so that they do not arrive synchronously at the plurality of trigger machines.

4. The method according to claim 1, further comprising a one of the following steps:
storing each of the result vectors that is determined as infringing the at least one trigger range in at least one storage unit; and
generating a timestamp for each of the result vectors and storing the result vectors with the respective timestamps in at least one storage unit, wherein the timestamp of each of the result vectors that is determined as infringing the at least one trigger range is stored separately in the at least one storage unit.

5. The method according to claim 1, wherein:
a plurality of signals under analysis are evaluated via the plurality of signal paths, wherein each of the plurality of signals under analysis has been converted into the frequency domain; and
a plurality of result vectors of the plurality of signals under analysis are transmitted via the plurality of signal paths to the plurality of trigger machines.

6. The method according to claim 1, wherein:
the plurality of signal paths are evaluated in parallel; and/or
the plurality of result vectors provide a time reference to one another; and/or
each of the trigger machines processes a respective one of the result vectors; and/or
a number of vector elements in each result vector corresponds to the length of the FFT in the transformation units; and/or
a trigger status of each of the trigger machines is provided to the evaluation unit once the respective trigger machine has evaluated a last vector element of the respective result vector with regard to the at least one trigger range; and/or
the at least one trigger range comprises either a mask that defines an area within a spectrum, or a line, and the at least one trigger range is infringed whenever a vector element of at least one result vector either is disposed within the area defined by the mask, or undershoots or overshoots the line.

7. A frequency-mask trigger unit, for evaluating a signal under analysis via a plurality of signal paths, the frequency-mask trigger unit comprising:
a plurality of trigger machines connected to an evaluation unit; and
a plurality of transformation units, each configured to configured to determine a Fast Fourier Transform (FFT) via a filter and a delay device; and
wherein each signal path connects an output of one of the plurality of transformation units to an input of a respective one of the trigger machines,
wherein an interferer occurring within an edge region in a spectrum determined by each of the transformation units is identified,
wherein the trigger machines are configured to receive a plurality of result vectors of the signal under analysis via the plurality of signal paths, and
wherein each of the trigger machines is configured to determine whether at least one of the plurality of result vectors infringes the at least one trigger range.

8. The frequency-mask trigger unit according to claim 7, wherein each of the trigger machines provides a trigger status to the evaluation unit once the respective trigger machine has determined whether the respective result vector infringes the at least one trigger range.

9. The frequency-mask trigger unit according to claim 7, further comprising:
a delay unit configured to delay at least one of the result vectors by at least one system-clock pulse relative to the other result vectors, so that they do not arrive synchronously at the plurality of trigger machines.

10. The frequency-mask trigger unit according to claim 7, further comprising:
at least one storage unit;

wherein the evaluation unit is configured either (1) to store each of the result vectors that is determined as infringing the at least one trigger range in the at least one storage unit, or (2) to generate a timestamp for each of the result vectors and to store the result vectors with the respective timestamps in the at least one storage unit, wherein the timestamp of each of the result vectors that is determined as infringing the at least one trigger range is stored separately in the at least one storage unit.

11. The frequency-mask trigger unit according to claim 7, wherein:
a plurality of signals under analysis are evaluated via the plurality of signal paths, wherein each of the plurality of signals under analysis has been converted into the frequency domain; and
a plurality of result vectors of the plurality of signals under analysis are transmitted via the plurality of signal paths to the plurality of trigger machines.

12. The frequency-mask trigger unit according to claim 7, wherein:
the trigger machines are arranged in a manner facilitating evaluation of the plurality of signal paths in parallel; and/or
the plurality of result vectors provide a time reference to one another; and/or
each of the trigger machines is configured to process a respective one of the result vectors; and/or
a number of vector elements in each result vector corresponds to the length of the FFT in the transformation units; and/or
each trigger machine provides a trigger status to the evaluation unit once it has evaluated a last vector element of the respective result vector with regard to the at least one trigger range; and/or
the at least one trigger range comprises either a mask that defines an area within a spectrum, or a line, and the at least one trigger range is infringed whenever a vector element of at least one result vector either is disposed within the area defined by the mask, or undershoots or overshoots the line.

13. A non-transitory computer-readable storage medium carrying one or more sequences of one or more instructions which, when executed by one or more processors, cause an apparatus to at least perform the following steps:
providing at least one trigger range to a plurality of trigger machines;
transmitting each of a plurality of result vectors of a signal under analysis via a plurality of signal paths, wherein each signal path connects an output of one of a plurality of transformation units to an input of a respective one of the trigger machines, wherein the signal under analysis has been converted into the frequency domain;
determining, by each of the transformation units, a Fast Fourier Transform (FFT) via a filter and a delay device;
identifying an interferer occurring within an edge region in a spectrum determined by each of the transformation units; and
determining, by each of the trigger machines, whether at least one of the plurality of result vectors infringes the at least one trigger range.

14. The non-transitory computer-readable storage medium according to claim 13, wherein the apparatus is caused to further perform:
providing a trigger status of each of the trigger machines to an evaluation unit once the respective trigger machine has determined whether the respective result vector infringes the at least one trigger range.

15. The non-transitory computer-readable storage medium according to claim 13, wherein the apparatus is caused to further perform:
delaying at least one of the result vectors by at least one system-clock pulse relative to the other result vectors, so that they do not arrive synchronously at the plurality of trigger machines.

16. The non-transitory computer-readable storage medium according to claim 13, wherein the apparatus is caused to further perform a one of the following steps:
storing each of the result vectors that is determined as infringing the at least one trigger range in at least one storage unit; and
generating a timestamp for each of the result vectors and storing the result vectors with the respective timestamps in at least one storage unit, wherein the timestamp of each of the result vectors that is determined as infringing the at least one trigger range is stored separately in the at least one storage unit.

17. The non-transitory computer-readable storage medium according to claim 13, wherein:
a plurality of signals under analysis are evaluated via the plurality of signal paths, wherein each of the plurality of signals under analysis has been converted into the frequency domain; and
a plurality of result vectors of the plurality of signals under analysis are transmitted via the plurality of signal paths to the plurality of trigger machines.

18. The non-transitory computer-readable storage medium according to claim 13, wherein:
the plurality of signal paths are evaluated in parallel; and/or
the plurality of result vectors provide a time reference to one another; and/or
each of the trigger machines processes a respective one of the result vectors; and/or
a number of vector elements in each result vector corresponds to the length of the FFT in the transformation units; and/or
a trigger status of each of the trigger machines is provided to the evaluation unit once the respective trigger machine has evaluated a last vector element of the respective result vector with regard to the at least one trigger range; and/or
the at least one trigger range comprises either a mask that defines an area within a spectrum, or a line, and the at least one trigger range is infringed whenever a vector element of at least one result vector either is disposed within the area defined by the mask, or undershoots or overshoots the line.

* * * * *